United States Patent
Chang et al.

(10) Patent No.: US 9,773,785 B2
(45) Date of Patent: Sep. 26, 2017

(54) SEMICONDUCTOR DEVICE

(71) Applicant: SAMSUNG ELECTRONICS CO., LTD., Suwon-si, Gyeonggi-do (KR)

(72) Inventors: Kyu Baik Chang, Seoul (KR); Byoung Hak Hong, Seoul (KR); Yoon Suk Kim, Hwaseong-si (KR); Seung Hyun Song, Hwaseong-si (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 15/219,374

(22) Filed: Jul. 26, 2016

(65) Prior Publication Data

US 2017/0162566 A1     Jun. 8, 2017

(30) Foreign Application Priority Data

Dec. 3, 2015    (KR) ........................ 10-2015-0171788

(51) Int. Cl.
| | |
|---|---|
| *H01L 27/088* | (2006.01) |
| *H01L 29/06* | (2006.01) |
| *H01L 27/092* | (2006.01) |
| *H01L 29/78* | (2006.01) |

(52) U.S. Cl.
CPC ...... *H01L 27/0886* (2013.01); *H01L 27/0924* (2013.01); *H01L 29/7843* (2013.01); *H01L 29/7845* (2013.01)

(58) Field of Classification Search
CPC ............. H01L 27/0886; H01L 27/0924; H01L 29/7843; H01L 29/7845
USPC ................................................. 257/369, 401
See application file for complete search history.

(56) References Cited

U.S. PATENT DOCUMENTS

| 8,878,309 B1 | 11/2014 | Hong et al. |
|---|---|---|
| 2013/0037886 A1 | 2/2013 | Tsai et al. |
| 2013/0187237 A1 | 7/2013 | Yu et al. |
| 2014/0317581 A1 | 10/2014 | Chuang et al. |

(Continued)

FOREIGN PATENT DOCUMENTS

| JP | 2012-238630 A | 12/2012 |
|---|---|---|
| KR | 10-2015-0022091 A | 3/2015 |

OTHER PUBLICATIONS

Ibrahim A Alhomoudi, et al., Residual stresses and Raman shift relation in anatase $TiO_2$ thin film; Thin Solid Films 517 (2009); pp. 4372-4378.

*Primary Examiner* — Cuong Q Nguyen
*Assistant Examiner* — Tong-Ho Kim
(74) *Attorney, Agent, or Firm* — Lee & Morse P.C.

(57) ABSTRACT

A semiconductor device includes first and second fins on first and second regions of a substrate, a first trench overlapping a vertical end portion of the first fin and including first upper and lower portions, the first upper and lower portions separated by an upper surface of the first fin, a second trench overlapping a vertical end portion of the second fin and including second upper and lower portions separated by an upper surface of the second fin, a first dummy gate electrode including first metal oxide and filling layers, the first metal oxide layer filling the first lower portion of the first trench and is along a sidewall of the first upper portion of the first trench, and a second dummy gate electrode filling the second trench and including second metal oxide and filling layers, the second metal oxide layer extending along sidewalls of the second trench.

20 Claims, 24 Drawing Sheets

(56) References Cited

U.S. PATENT DOCUMENTS

| | | | |
|---|---|---|---|
| 2015/0050792 A1 | 2/2015 | Samavedam et al. | |
| 2015/0054089 A1* | 2/2015 | Hong | H01L 27/0886 257/401 |
| 2015/0115373 A1 | 4/2015 | Yu et al. | |
| 2016/0043222 A1* | 2/2016 | Cho | H01L 29/7845 257/369 |
| 2016/0133525 A1* | 5/2016 | Lee | H01L 29/665 438/589 |
| 2016/0358914 A1* | 12/2016 | Kim | H01L 27/0886 |

\* cited by examiner

SEMICONDUCTOR DEVICE

CROSS-REFERENCE TO RELATED APPLICATION

Korean Patent Application No. 10-2015-0171788, filed on Dec. 3, 2015, in the Korean Intellectual Property Office, and entitled: "Semiconductor Device," is incorporated by reference herein in its entirety.

BACKGROUND

1. Field

The present disclosure relates to a semiconductor device.

2. Description of the Related Art

Recently, a semiconductor device has a small size and high performance. Accordingly, even a small structural difference between transistors included in the semiconductor device exerts a great influence on the performance of the semiconductor device.

As one of scaling techniques to heighten the density of a semiconductor device, a multi-gate transistor has been proposed, in which a fin-shaped or nanowire-shaped silicon body is formed on a substrate and a gate is formed on a surface of the silicon body. Since such a multi-gate transistor uses a three-dimensional (3D) channel, it is easy to perform scaling. In order to improve the performance of a miniaturized semiconductor device, it is necessary to adjust stress that is applied to a channel region of the multi-gate transistor.

SUMMARY

Embodiments relative to a semiconductor device which has an improved performance through adjustment of stress that is applied to a channel region of a transistor using a dummy gate.

According to some embodiments, there is provided a semiconductor device including a substrate having a first region and a second region, a first active fin projecting from the substrate of the first region, a second active fin projecting from the substrate of the second region, an interlayer insulating layer covering the first active fin and the second active fin on the substrate, a first trench overlapping a vertical end portion of the first active fin in the interlayer insulating layer and including a first upper portion and a first lower portion, wherein the first upper portion of the first trench and the first lower portion of the first trench discriminate against each other on the basis of an upper surface of the first active fin, a second trench overlapping a vertical end portion of the second active fin in the interlayer insulating layer and including a second upper portion and a second lower portion, wherein the second upper portion of the second trench and the second lower portion of the second trench discriminate against each other on the basis of an upper surface of the second active fin, a first dummy gate electrode filling the first trench and including a first metal oxide layer and a first filling metal layer, wherein the first metal oxide layer fills the first lower portion of the first trench and is formed along a side wall of the first upper portion of the first trench and a second dummy gate electrode filling the second trench and including a second metal oxide layer and a second filling metal layer, wherein the second metal oxide layer extends along a side wall and a bottom surface of the second trench.

According to some embodiments, there is provided a semiconductor device including a substrate having a first region and a second region, a first active fin projecting from the substrate of the first region, a second active fin projecting from the substrate of the second region, an interlayer insulating layer covering the first active fin and the second active fin on the substrate, a first trench overlapping a vertical end portion of the first active fin in the interlayer insulating layer and including a first upper portion and a first lower portion, wherein the first upper portion of the first trench and the first lower portion of the first trench discriminate against each other on the basis of an upper surface of the first active fin, a second trench non-overlapping a vertical end portion of the second active fin in the interlayer insulating layer, a first dummy gate electrode filling the first trench and including a first metal oxide layer and a first filling metal layer, wherein the first metal oxide layer fills the first lower portion of the first trench and is formed along a side wall of the first upper portion of the first trench and a second dummy gate electrode filling the second trench and including a second metal oxide layer and a second filling metal layer, wherein the second metal oxide layer extends along a side wall and a bottom surface of the second trench.

According to some embodiments, there is provided a semiconductor device including a substrate including a first region and a second region, a first active fin projecting from the first region of the substrate, a second active fin projecting from the second region of the substrate, an interlayer insulating layer covering the first active fin and the second active fin on the substrate, a first trench overlapping a vertical end portion of the first active fin in the interlayer insulating layer and including a first upper portion and a first lower portion, the first upper and lower portions being separated from each other at an upper surface of the first active fin, a second trench overlapping a vertical end portion of the second active fin in the interlayer insulating layer and including a second upper portion and a second lower portion, the second upper and lower portions of the second trench being separated from each other at an upper surface of the second active fin, a first dummy gate electrode filling the first trench and including a first metal oxide layer and a first filling metal layer, the first metal oxide layer completely filling the first lower portion of the first trench and being conformal along a side wall of the first upper portion of the first trench, and a second dummy gate electrode filling the second trench and including a second metal oxide layer and a second filling metal layer, the second metal oxide layer being conformal along side walls of each of the second upper and lower portions of the second trench.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Hereinafter, referring to FIGS. 1 to 5, a semiconductor device according to some embodiments will be described.

Figure 1:
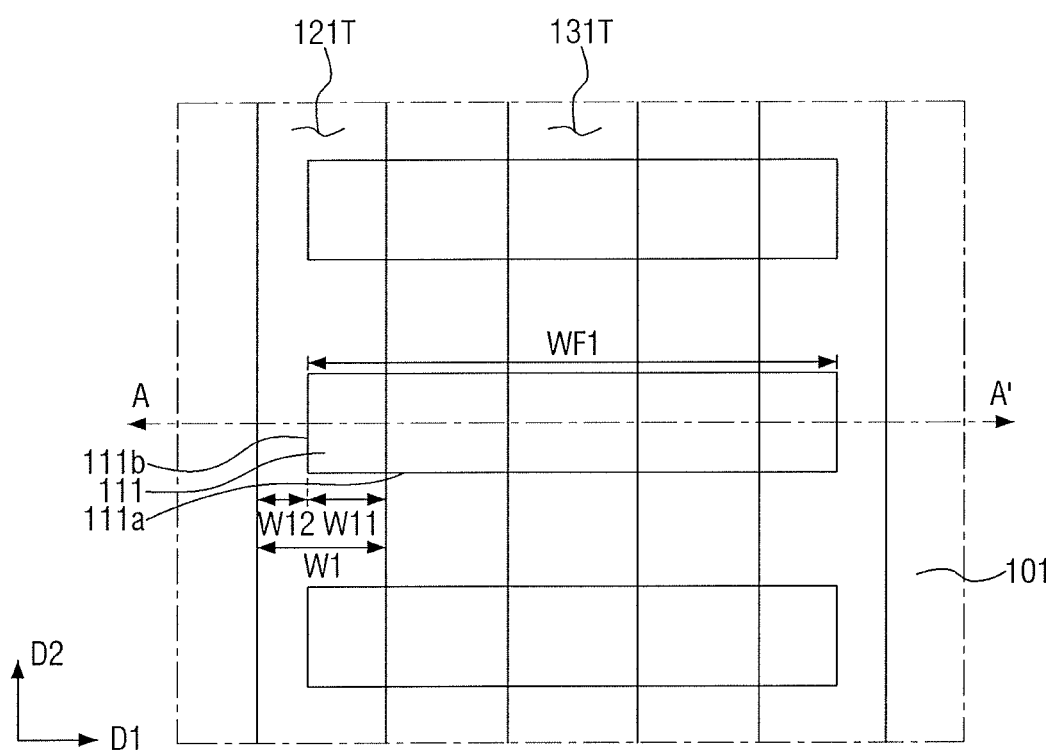
FIG. 1 illustrates a layout diagram of a semiconductor device according to some embodiments.
Figure 2:
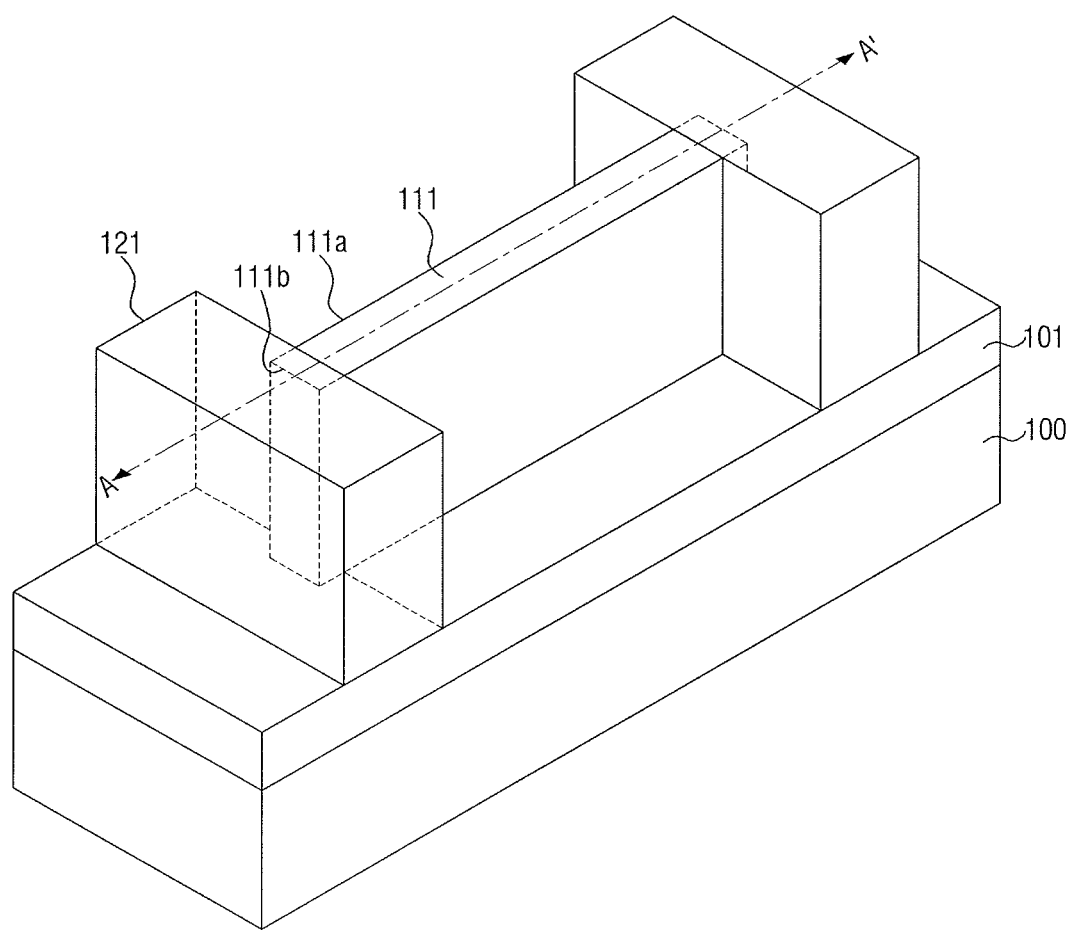
FIG. 2 illustrates a perspective view of FIG. 1.
Figure 3:
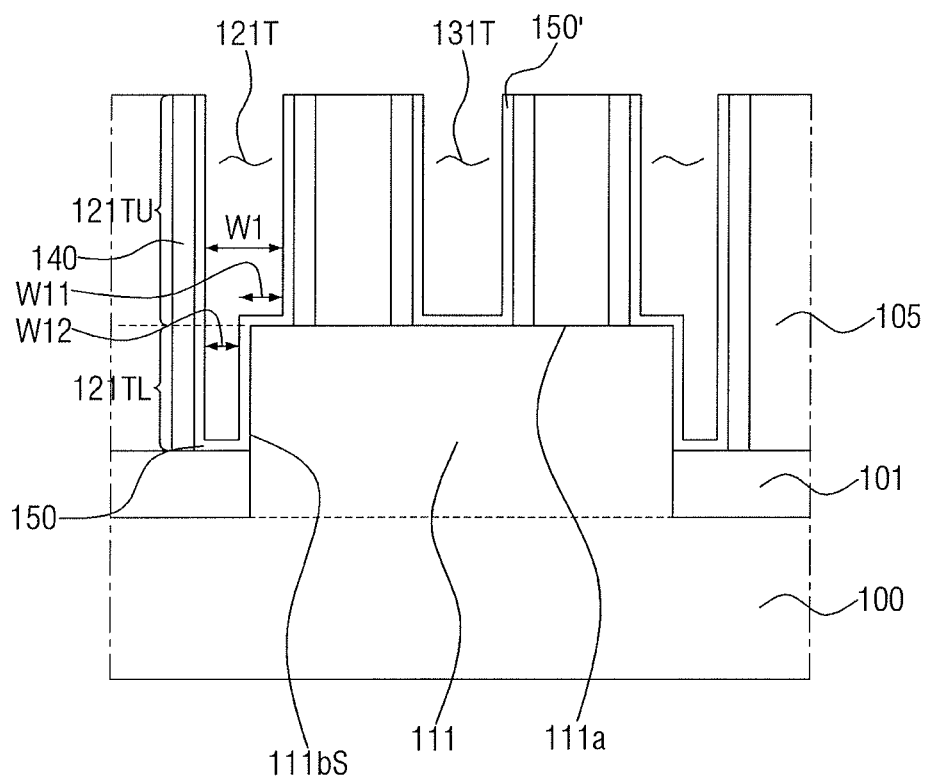
FIGS. 3 and 4 illustrate cross-sectional views taken along line A-A' of FIG. 1.
Figure 4:
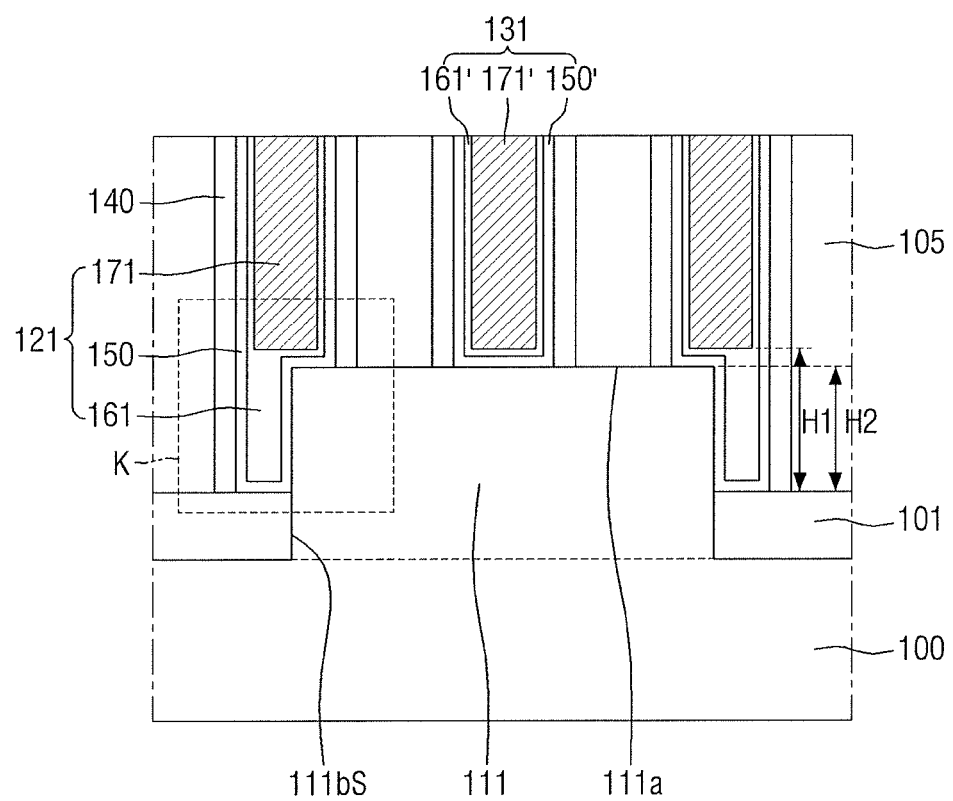
Figure 5:
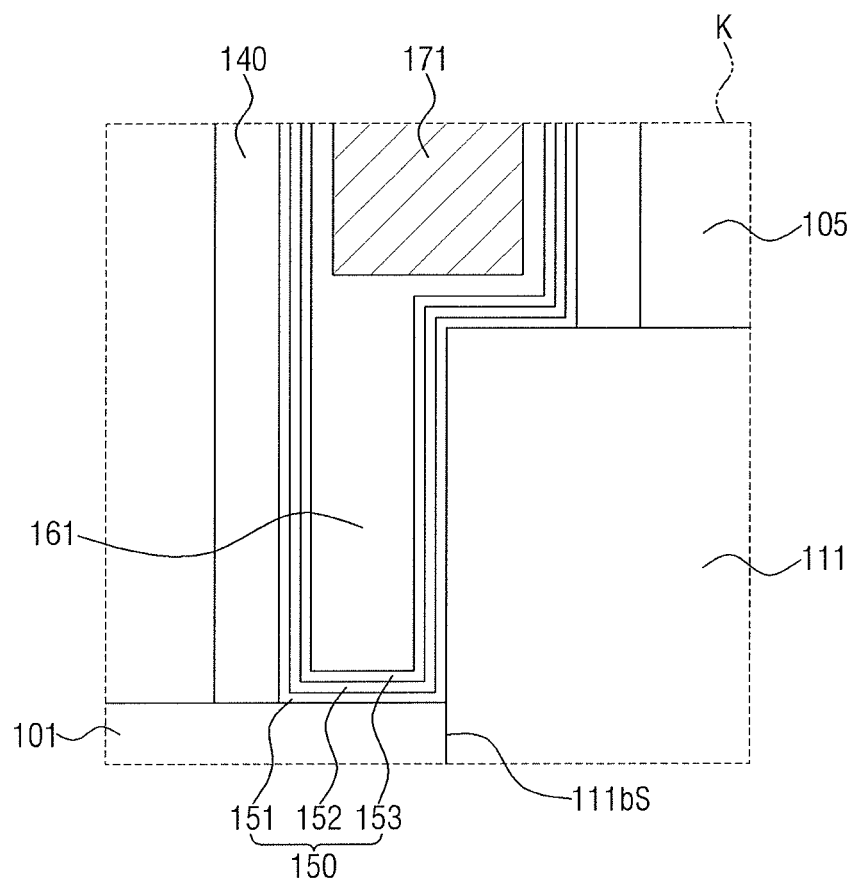
FIG. 5 illustrates an enlarged view of a region K of FIG. 4.

FIG. 1 is a layout diagram of a semiconductor device according to some embodiments. For convenience in explanation, illustration of an interlayer insulating layer 105, a spacer 140, and a first filling metal layer 150 is omitted in the drawing. FIG. 2 is a perspective view of FIG. 1. For convenience in explanation, illustration of the interlayer insulating layer 105, a first gate electrode 131, the spacer 140, a dummy gate insulating layer, a first metal oxide layer 161, and the first filling metal layer 150 is omitted, and only the shape of a first dummy gate electrode 121 is illustrated. FIGS. 3 and 4 are cross-sectional views taken along line A-A' of FIG. 1, and FIG. 5 is an enlarged view of a region K of FIG. 4.

Referring to FIGS. 1 to 5, a first trench 121T and a third trench 131T may be formed to expose a part of a first active fin 111 on a substrate 100.

Figure 10A:
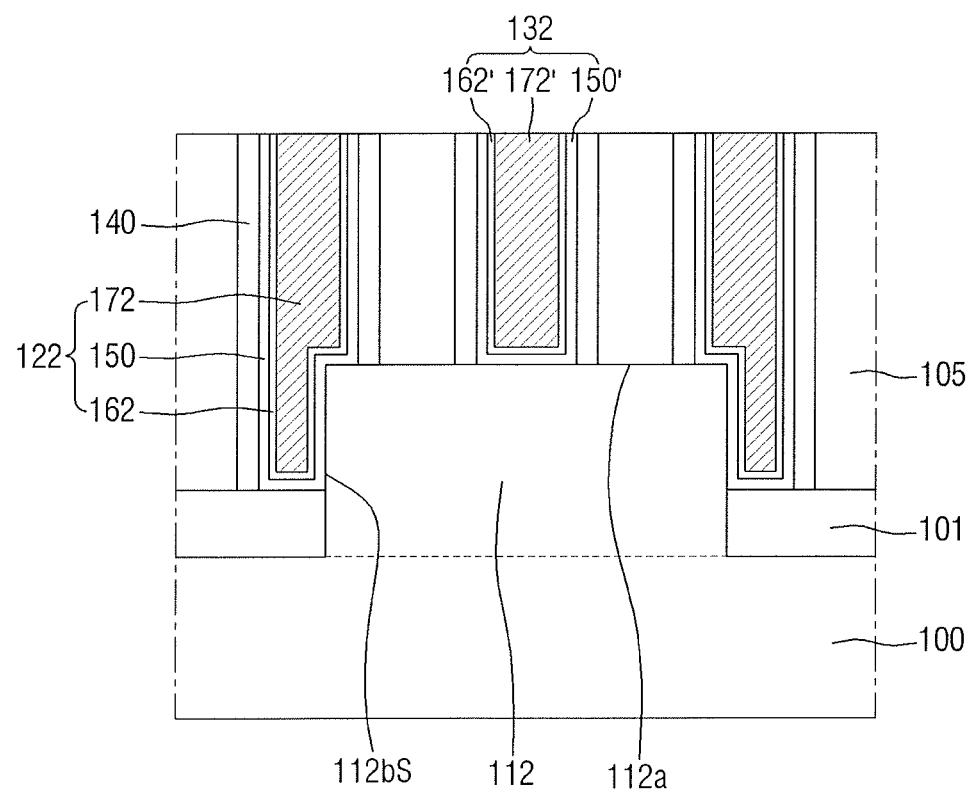
Figure 10B:
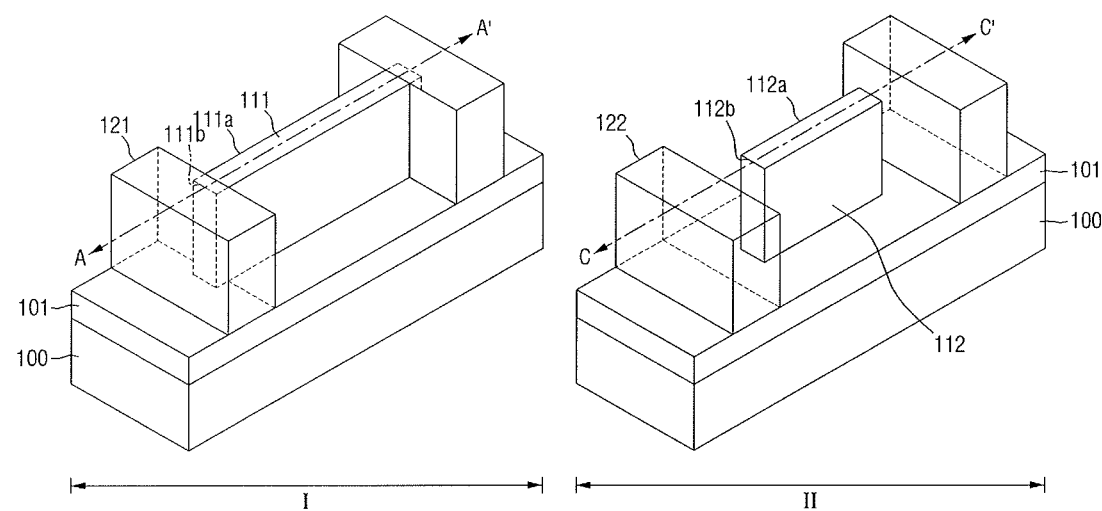
FIGS. 10b and 10c illustrate perspective and corresponding cross-sectional views of the first and second regions according to embodiments.

The substrate 100 may include a first region and a second region (e.g., FIG. 10b). The first region and the second region may be regions that are adjacent to each other or regions that are spaced apart from each other. A semiconductor device according to some embodiments, as illustrated in FIGS. 1 to 5, may be formed in the first region of the substrate 100. In some embodiments, the first region of the substrate 100 may be, e.g., a region in which a PMOS is formed.

The substrate 100 may be made of, e.g., bulk silicon or SOI (Silicon-On-Insulator). Unlike this, the substrate 100 may be a silicon substrate, or may include another material, e.g., silicon germanium, indium antimonide, lead telluride, indium arsenide, indium phosphide, gallium arsenide, or gallium antimonide. Further, the substrate 100 may be provided by forming an epitaxial layer on a base substrate.

The first active fin 111 may be formed in the first region of the substrate 100. The first active fin 111 may be formed to project, e.g., upward, from the substrate 100. The first active fin 111 may be formed to extend in a first direction D1.

The first active fin 111 may include a long side 111a and a short side 111b. Further, the first active fin 111 may include a side wall 111bs that includes the short side 111b of the first active fin 111. The long side 111a of the first active fin 111 may extend in the first direction D1. The short side 111b of the first active fin 111 may extend in a second direction D2 that crosses the first direction D1. The long side 111a of the first active fin 111 may be longer than the short side 111b of the first active fin 111, e.g., the first active fin 111 may be formed so that the long side 111a and the short side 111b face each other.

In the drawing, it is exemplarily illustrated that the first active fin 111 is in a cuboidal shape, but is not limited thereto. The first active fin 111 may also be in a chamfered shape, e.g., corner portions of the first active fin 111 may be rounded. It is noted that even when the corner portions of the first active fin 111 are rounded, the long side 111a and the short side 111b are distinguishable from each other.

The first active fin 111 may be formed using an epitaxial layer that is formed on a base substrate. In this case, the epitaxial layer may include, e.g., silicon or germanium that is an elemental semiconductor material. Further, the epitaxial layer may include compound semiconductor, and for example, the first active fin 111 may include group IV-IV compound semiconductor or group III-V compound semiconductor. In detail, as an example of the group IV-IV compound semiconductor, the epitaxial layer may be made of a binary compound including at least two of carbon (C), silicon (Si), germanium (Ge), and tin (Sn), a ternary compound, or a compound including the above-described elements doped with group IV elements. As an example of the group III-V compound semiconductor, the epitaxial layer may be made of a binary compound formed through combination of at least one of group III elements, such as aluminum (Al), gallium (Ga), and indium (In), and one of group V elements, such as phosphorus (P), arsenide (As), and antimony (Sb), a ternary compound, or a quaternary compound.

The first active fin 111 may include a compression stress material. For example, the compression stress material may be a material having higher lattice constant than the lattice constant of Si, and for example, SiGe. The compression stress material may apply a compression stress to the first active fin 111 to improve mobility of carriers of a channel region.

A field insulating layer 101 may be formed on the substrate 100 to cover a part of the first active fin 111. The field insulating layer 101 may be formed of, e.g., a material that includes at least one of silicon oxide, silicon nitride, and silicon oxynitride.

The interlayer insulating layer 105 may be formed on the substrate 100 to cover the first active fin 111. The interlayer insulating layer 105 may include, e.g., at least one of a low-k material, an oxide layer, a nitride layer, and oxynitride layer. The low-k material may include FOX (Flowable Oxide), TOSZ (Tonen SilaZen), USG (Undoped Silica Glass), BSG (Borosilica Glass), PSG (PhosphoSilica Glass), BPSG (BoroPhosphoSilica Glass), PETEOS (Plasma Enhanced Tetra Ethyl Ortho Silicate), FSG (Fluoride Silicate Glass), HDP (High Density Plasma), PEOX (Plasma Enhanced Oxide), FCVD (Flowable CVD), or a combination thereof, but is not limited thereto.

The first trench 121T may be formed in the first region of the substrate 100 to extend in the second direction D2 (FIG. 1). In detail, the first trench 121T may be formed in an insulating layer. Here, the insulating layer may include the interlayer insulating layer 105 and the field insulating layer 101.

The first trench 121T may expose the short side 111b of the first active fin 111. That is, the first trench 121T may overlap a vertical end portion of the first active fin 111.

The first trench 121T may include a first upper portion 121TU and a first lower portion 121TL on the basis of the upper surface of the first active fin 111. That is, the first upper portion 121TU of the first trench 121T may be an upper portion on the basis of the upper surface of the first active fin 111, e.g., the first upper portion 121TU may be above the upper surface of the first active fin 111 and define the top of the first trench 121T. The first lower portion 121TL of the first trench 121T may be a lower portion on the basis of the upper surface of the first active fin 111, e.g., first lower portion 121TL may be below the upper surface of the first active fin 111.

At least a part of a side wall of the first lower portion 121TL of the first trench 121T may be defined by the side wall 111bs that includes the short side 111b of the first active fin 111. At least a part of the side wall of the first upper portion 121TU of the first trench 121T may be defined by the insulating layer, e.g., by the interlayer insulating layer 105.

The first upper portion 121TU of the first trench 121T may have a larger width in the first direction D1 than the first lower portion 121TL. In detail, the first upper portion 121TU may have a width W1 in the first direction D1, with a first portion that overlaps the vertical end portion of the first active fin 111 having a width W11, and a second portion that does not overlap the vertical end portion of the first active fin 111 having a width W12. For example, W1 may be the widest width of the first trench 121T, and may equal the sum of W11 and W12. Further, the width W12 may be the width of the first lower portion 121TL. The value of W12 may be the value to the extent that the first metal oxide layer 161 to be described later can fill the first lower portion 121TL of the first trench 121T.

The width of the first upper portion 121TU of the first trench 121T may be W1, and the width of the first lower portion 121TL of the first trench 121T may be W12. The width W1 of the first upper portion 121TU of the first trench 121T may be, for example, larger than the width W12 of the first lower portion 121TL of the first trench 121T.

The spacer 140 may be formed on both side walls of the first trench 121T. The spacer 140 that is formed on one side wall of the first trench 121T may be formed up to a bottom surface of the first trench 121T. The spacer 140 that is formed on another side wall of the first trench 121T may be formed up to an upper surface of the first trench 121T. For example, as the first trench 121T includes first upper and lower portions 121TU and 121TL that have different widths, the spacer 140 may be on both side walls in the first upper portion 121TU, and only on one side wall in the first lower portion 121TL. The spacer 140 may extend in the second direction D2. Although it is illustrated in the drawing that the spacer 140 has a single-layer structure, it is not limited thereto. For example, the spacer 140 may have a multilayer structure. The spacer 140 may include, e.g., silicon nitride (SiN), silicon oxynitride (SiON), silicon oxide (SiO$_2$), silicon oxycarbide nitride (SiOCN), silicon carbide nitride (SiCN), or a combination thereof.

The first dummy gate electrode 121 may fill the first trench 121T. The first dummy gate electrode 121 may be formed to surround the vertical end portion of the first active fin 111. Referring to FIG. 4, the first dummy gate electrode 121 may include a first filling metal layer 150, a first metal oxide layer 161, a dummy gate insulating layer, and a first dummy metal gate 171.

The first filling metal layer 150 may be formed along the side wall and the bottom surface of the first trench 121T. In detail, the first filling metal layer 150 may be formed on at least a part of the side wall 111bs including the short side 111b of the first active fin 111 and the upper surface of the first active fin 111.

The first filling metal layer 150 may include, e.g., a high-k insulating layer 151, a first metal layer 152, and a second metal layer 153 (FIG. 5). However, the present disclosure is not limited thereto. The first filling metal layer 150 may further include other layers. Further, although it is illustrated in the drawing that each of the high-k insulating layer 151, the first metal layer 152, and the second metal layer 153 is a single layer, the present disclosure is not limited thereto. For example, each of the high-k insulating layer 151, the first metal layer 152, and the second metal layer 153 may be a multilayer.

The high-k insulating layer 151 may include at least one of, e.g., hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, but is not limited thereto.

The first metal layer 152 and the second metal layer 153 may adjust a work function. For example, the first metal layer 152 may include TiN, and the second metal layer 153 may include TaN, but the present disclosure is not limited thereto. For example, the first metal layer 152 and the second metal layer 153 may include at least one of TiN, TaN, TiC, and TaC.

The first metal oxide layer 161 may fill at least a part of the first lower portion 121TL of the first trench 121T. In some embodiments, the first metal oxide layer 161 may fill the whole first lower portion 121TL of the first trench 121T. The first metal oxide layer 161 may be formed along the side wall of the first upper portion 121TU of the first trench 121T.

The first metal oxide layer 161 may be formed up to a first height H1 on the basis of the lowermost surface of the first dummy gate electrode 121. If it is assumed that the height of the upper surface of the first active fin 111 on the basis of the lowermost surface of the first dummy gate electrode 121 is H2, for example, H1 may be higher than H2. However, the present disclosure is not limited thereto. For example, H1 may be equal to H2, or H2 may be larger than H1.

The first metal oxide layer 161 may be formed through oxidation of the first filling metal layer 150 that includes titanium (Ti). That is, the first metal oxide layer 161 may include, e.g., titanium oxide.

The dummy gate insulating layer may be formed between the bottom surface of the first trench 121T and the first filling metal layer 150. The dummy gate insulating layer may include, e.g., silicon oxide.

The first dummy metal gate 171 may fill a remaining space of the first trench 121T after the first filling metal layer 150 and the first metal oxide layer 161 are formed in the first trench 121T. For example, as illustrated in FIG. 4, the first dummy metal gate 171 may extend only in the first upper portion 121TU above the first metal oxide layer 161, while the first metal oxide layer 161 may completely fill the first lower portion 121TL. The first dummy metal gate 171 may include a conductive material. Examples of such a conductive material may include doped polysilicon, titanium nitride (TiN), tantalum nitride (TaN), tungsten nitride (WN), titanium (Ti), tantalum (Ta), and tungsten (W), but the present disclosure is not limited thereto.

The third trench 131T may be formed in the first region of the substrate 100 to extend in the second direction D2. In detail, the third trench 131T may be formed within the interlayer insulating layer 105. The third trench 131T may be formed to be spaced apart from the first trench 121T in the first direction D1. The width of the first trench 121T may be equal to the width of the third trench 131T, e.g., width W1 of the first trench 121T may be equal to the width of the third trench 131T in the first direction D1, but the present disclosure is not limited thereto. For example, the width of the first trench 121T may be different from the width of the third trench 131T, and this will be described in detail later.

The third trench 131T may not expose the short side 111b of the first active fin 111. That is, the third trench 131T may expose the upper surface of the first active fin 111 without overlapping the vertical end portion of the first active fin 111. In other words, the third trench 131T may be positioned above the upper surface of the first active fin 111 to expose the upper surface of the first active fin 111, so a depth of the third trench 131T along a vertical direction, e.g., a direction along a normal to the upper surface of the first active fin 111, may be shorter than that of the first trench 121T.

The bottom surface of the third trench 131T may be defined by the upper surface of the first active fin 111. The side wall of the third trench 131T may be defined by the interlayer insulating layer 105.

The first gate electrode 131 may fill the third trench 131T. The first gate electrode 131 may be formed on the first active fin 111 to be spaced apart from the first dummy gate electrode 121. Further, the first gate electrode 131 may include a second filling metal layer 150', a third metal oxide layer 161', a gate insulating layer, and a first metal gate 171'.

The second filling metal layer 150' may be formed along a side wall and a bottom surface of the third trench 131T. The second filling metal layer 150' may have a shape that is different from the shape of the first filling metal layer 150, but may include substantially the same layer and material as those of the first filling metal layer 150. That is, in the same manner as the first filling metal layer 150, the second filling metal layer 150' may include a high-k insulating layer, a first metal layer, and a second metal layer. Further, the second filling metal layer 150' may have a single-layer or multilayer structure.

The third metal oxide layer 161' may extend along the side wall and the bottom surface of the third trench 131T on the second filling metal layer 150'. Unlike the first metal oxide layer 161, for example, the third metal oxide layer 161' may not fill at least a part of the third trench 131T. For example, as illustrated in FIG. 4, the third metal oxide layer 161' may be conformal on inner side walls and bottom of the third trench 131T, e.g., without filling a bottom of the third trench 131T.

The first metal gate 171' may include, e.g., substantially the same material as the material of the first dummy metal gate 171, but is not limited thereto. For example, as illustrated in FIG. 4, the depth of the first metal gate 171' may substantially equal the depth of the first dummy metal gate 171.

Hereinafter, referring to FIGS. 1, 2, 6, and 7, a semiconductor device according to some embodiments will be described. For clarity, the duplicate explanation of the contents as described above will be omitted, and explanation will be made regarding the different points between the embodiments.

Figure 6:
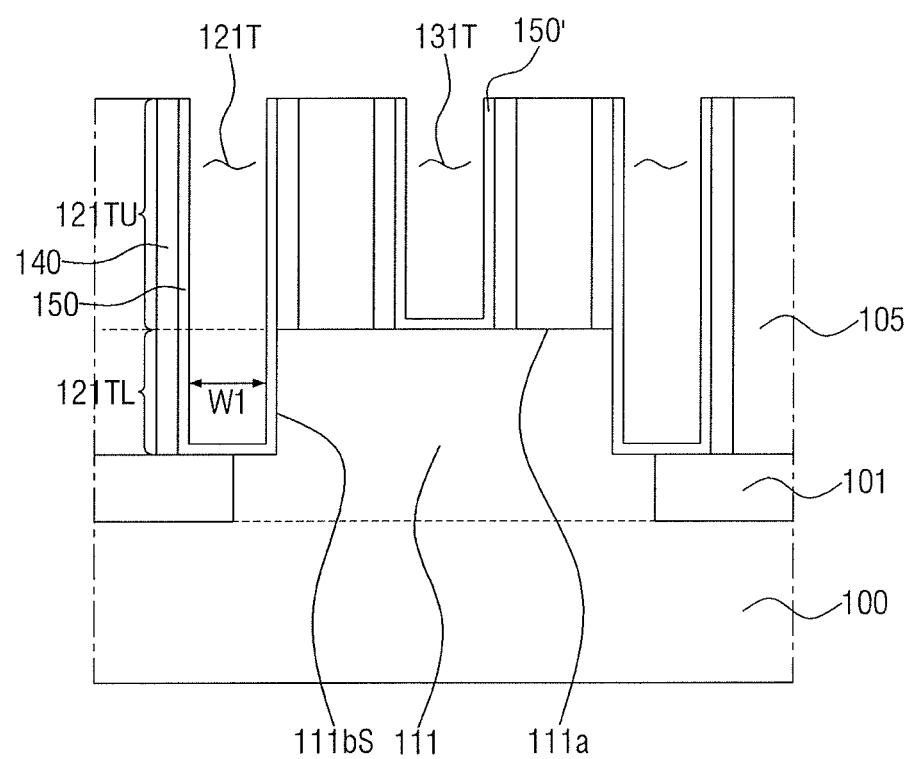
FIGS. 6 and 7 illustrate cross-sectional views taken along line A-A' of FIG. 1.
Figure 7:
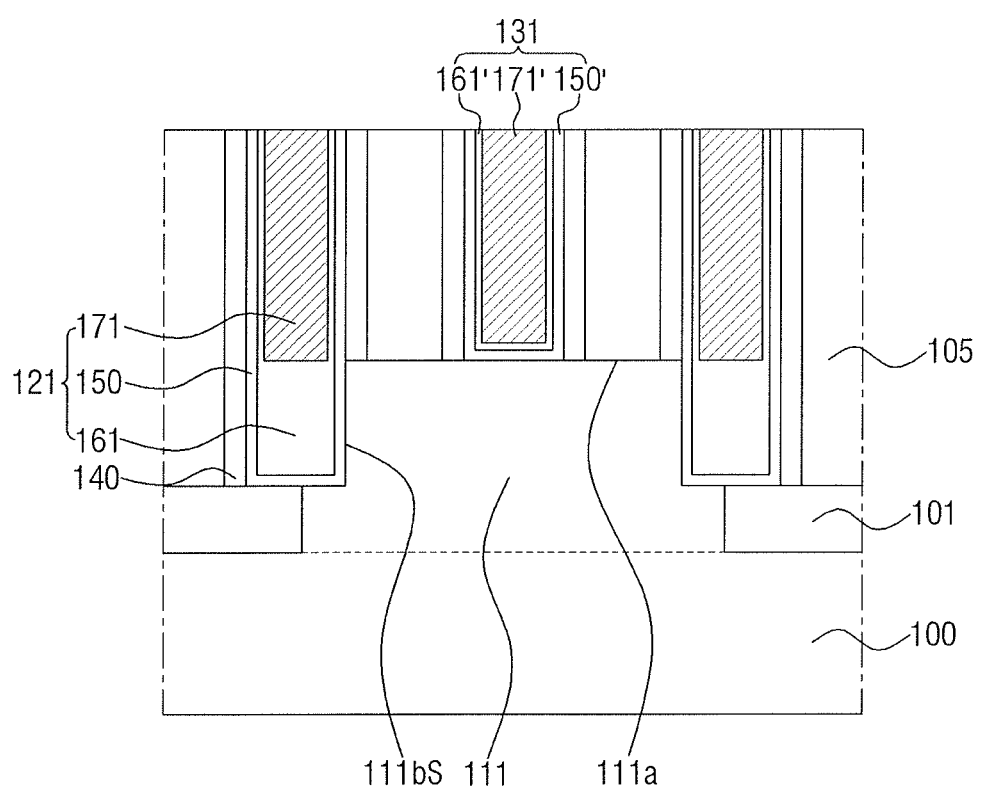

FIGS. 6 and 7 are cross-sectional views taken along line A-A' of FIG. 1.

Referring to FIGS. 1, 2, 6, and 7, a part of the bottom surface of the first lower portion 121TL of the first trench 121T may be defined by the first active fin 111. At least a part of the side wall of the first lower portion 121TL of the first trench 121T may be defined by the side wall 111bs that includes the short side 111b of the first active fin 111.

In detail, at least a part of the first lower portion 121TL of the first trench 121T may be formed in the first active fin 111. For example, as illustrated in FIG. 6, the first trench 121T may extend through a portion of the first active fin 111 to have a same uniform width in both the first upper and lower portions 121TU and 121TL. In this case, the length in the first direction D1 on the uppermost surface of the first active fin 111 may be different from the length in the first direction D1 on the boundary between the first active fin 111 and the bottom surface of the first trench 121T.

The width W1 of the first upper portion 121TU of the first trench 121T may be, for example, equal to the width W1 of the first lower portion 121TL of the first trench 121T. However, the present disclosure is not limited thereto. The width of the first upper portion 121TU of the first trench 121T may be equal to the width of the widest portion of the first lower portion 121TL of the first trench 121T. For example, in accordance with processes, a step height may occur in the portion of the side wall 111bs that includes the short side 111b of the first active fin 111. In this case, a step height may occur on the bottom surface or the side wall of the first lower portion 121TL of the first trench 121T.

In some embodiments, the first filling metal layer 150 may be formed along the side wall and the bottom surface of the first trench 121T. The first metal oxide layer 161 may fill at least a part of the first lower portion 121TL of the first trench 121T. In the drawing, it is illustrated that the first metal oxide layer 161 is formed up to the upper surface of the first active fin 111. However, this is merely for convenience in explanation, and the present disclosure is not limited thereto. For example, the first metal oxide layer 161 may be formed up to a position that is lower than the upper surface of the first active fin 111 or a position that is higher than the upper surface of the first active fin 111.

Hereinafter, referring to FIGS. 1, 3, and 8 to 10, a semiconductor device according to some embodiments will be described. For clarity, the duplicate explanation of the contents as described above will be omitted, and explanation will be made regarding the different points between the embodiments.

Figure 8:
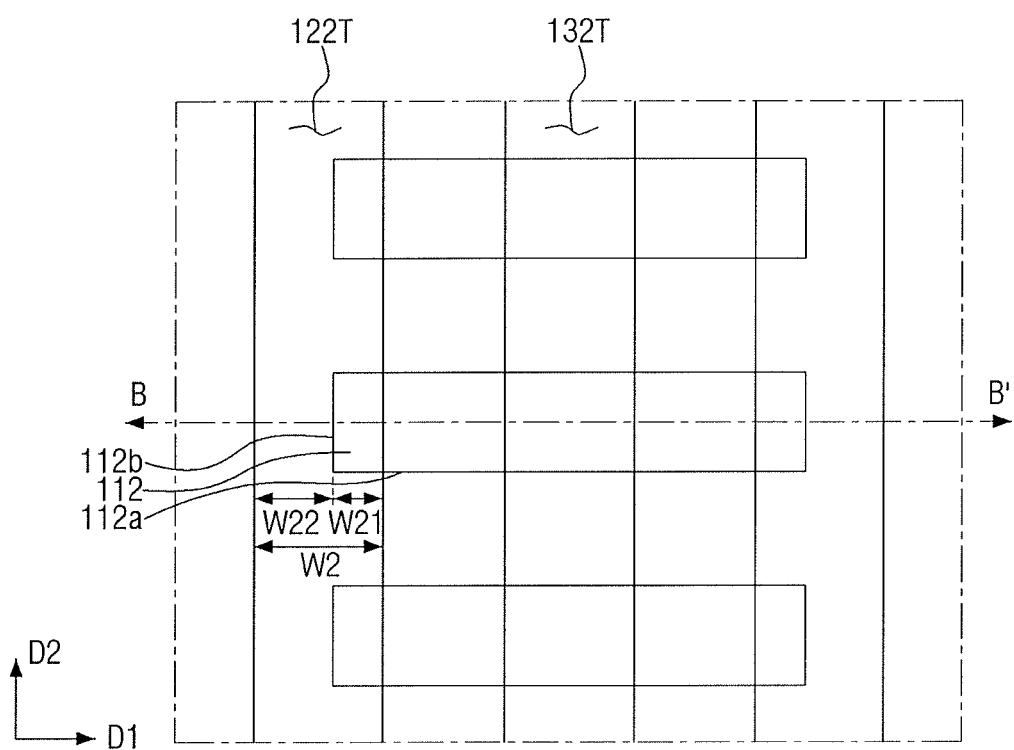
FIG. 8 illustrates a layout diagram of a semiconductor device according to some embodiments.
Figure 9:
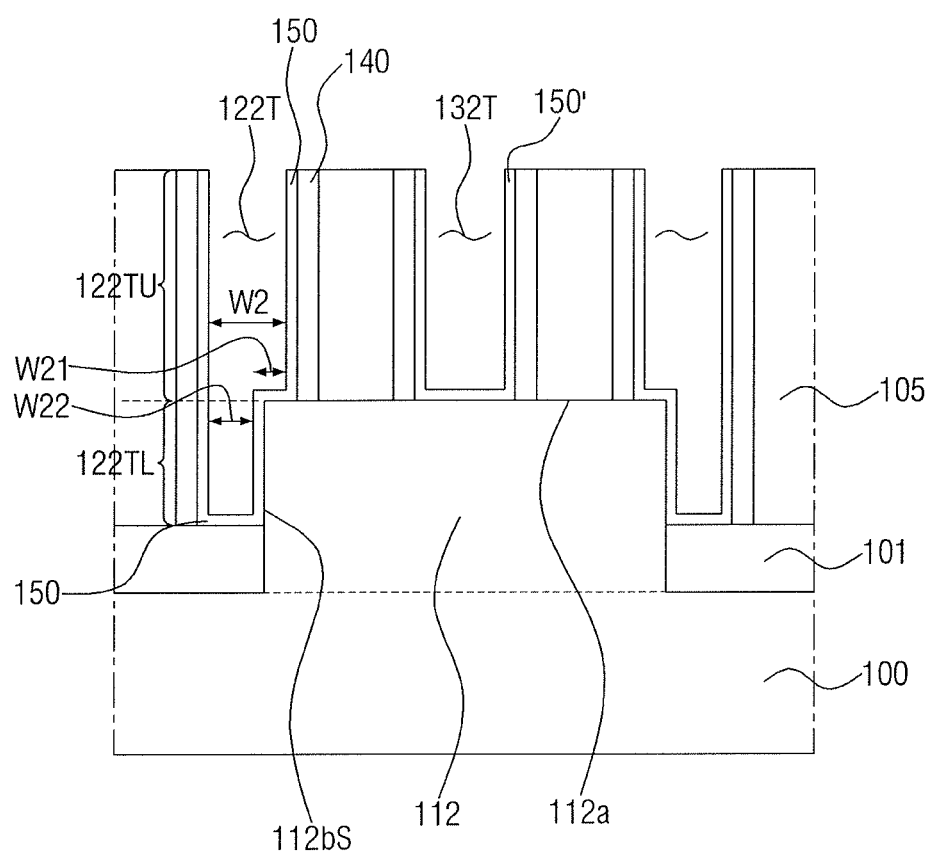
FIGS. 9 and 10a illustrate cross-sectional views taken along line B-B' of FIG. 8.

FIG. 8 is a layout diagram of a semiconductor device according to some embodiments. In FIG. 8, for convenience in explanation, illustration of the interlayer insulating layer 105, the spacer 140, and the first filling metal layer 150 is omitted. FIGS. 9 and 10a are cross-sectional views taken along line B-B' of FIG. 8.

First, referring to FIGS. 8 to 10a, a second trench 122T and a fourth trench 132T that expose a part of a second active fin 112 may be formed.

A semiconductor device according to some embodiments as illustrated in FIGS. 8 to 10a may be formed in the second region of the substrate 100. In some embodiments, the second region of the substrate 100 may be, e.g., a region in which an NMOS is formed.

The second active fin 112 may be formed in the second region of the substrate 100. The second active fin 112 may be formed to project from the substrate 100. The second active fin 112 may be formed to extend in the first direction D1. The second active fin 112 may include a long side 112a and a short side 112b. Further, the second active fin 112 may include a side wall 112bs that includes the short side 112b of the second active fin 112.

The long side 112a of the second active fin 112 may extend in the first direction D1. The short side 112b of the second active fin 112 may extend in the second direction D2 that crosses the first direction D1. The long side 112*a* of the second active fin 112 may be longer than the short side 112*b* of the second active fin 112. The second active fin 112 may be formed so that the long side 112*a* and the short side 112*b* face each other.

In the drawing, it is exemplarily illustrated that the second active fin 112 is in a cuboidal shape, but is not limited thereto. The second active fin 112 may also be in a chamfered shape. That is, corner portions of the second active fin 112 may be rounded. Even when the corner portions of the second active fin 112 are rounded, the long side 112*a* and the short side 112*b* may be distinguished from each other.

The interlayer insulating layer 105 may cover not only the first active fin 111 but also the second active fin 112.

The second active fin 112 may include the same material as the material of the substrate 100 or a tension stress material. For example, if the substrate 100 is made of Si, the second active fin 112 may be made of Si or may include a material having smaller lattice constant than the lattice constant of Si (e.g., SiC).

The second trench 122T may be formed in the second region of the substrate 100 to extend in the second direction D2. In detail, the second trench 122T may be formed in the insulating layer. Here, the insulating layer may include the interlayer insulating layer 105 and the field insulating layer 101.

The second trench 122T may expose the short side 112*b* of the second active fin 112. That is, the second trench 122T may overlap a vertical end portion of the second active fin 112.

The second trench 122T may include a second upper portion 122TU and a second lower portion 122TL on the basis of the upper surface of the second active fin 112. That is, the second upper portion 122TU of the second trench 122T may be an upper portion on the basis of the upper surface of the second active fin 112. The second lower portion 122TL of the second trench 122T may be a lower portion on the basis of the upper surface of the second active fin 112.

At least a part of a side wall of the second lower portion 122TL of the second trench 122T may be defined by the side wall 112*bs* that includes the short side 112*b* of the second active fin 112. At least a part of the side wall of the second upper portion 122TU of the second trench 122T may be defined by the insulating layer.

In the width W2 of the second trench 122T, the width of a portion in which the second trench 122T overlaps the vertical end portion of the second active fin 112 may be W21, and the width of a portion in which the second trench 122T does not overlap the vertical end portion of the second active fin 112 may be W22. W2 may be, for example, the widest width of the second trench 122T. In this case, W2 may be equal to the sum of W21 and W22.

The width of the second upper portion 122TU of the second trench 122T may be W2, and the width of the second lower portion 122TL of the second trench 122T may be W22. The width W2 of the second upper portion 122TU of the second trench 122T may be, for example, larger than the width W22 of the second lower portion 122TL of the second trench 122T.

The second dummy gate electrode 122 may fill the second trench 122T. The second dummy gate electrode 122 may be formed to surround the vertical end portion of the second active fin 112. The second dummy gate electrode 122 may include a first filling metal layer 150, a second metal oxide layer 162, a dummy gate insulating layer, and a second dummy metal gate 172.

The first filling metal layer 150 that is included in the second dummy gate electrode 122 may be substantially the same as the first filling metal layer 150 of the first dummy gate electrode 121.

The second metal oxide layer 162 may extend, e.g., conformally, along the side wall and the bottom surface of the second trench 122T. The second metal oxide layer 162 may be formed through oxidation of the first filling metal layer 150 that includes titanium (Ti). That is, the second metal oxide layer 162 may include, e.g., titanium oxide.

The second dummy metal gate 172 may include, for example, substantially the same material as the material of the first dummy metal gate 171. However, since the first trench 121T and the second trench 122T have shapes different from each other, the shape of the second dummy metal gate 172 may be different from the shape of the first dummy metal gate 171.

The fourth trench 132T may be formed in the second region of the substrate 100 to extend in the second direction D2. In detail, the fourth trench 132T may be formed within the interlayer insulating layer 105. The fourth trench 132T may be formed to be spaced apart from the second trench 122T. The width of the second trench 122T may be equal to the width of the fourth trench 132T, but the present disclosure is not limited thereto. For example, the width of the second trench 122T may be different from the width of the fourth trench 132T, and this will be described in detail later.

The fourth trench 132T may not expose the short side 112*b* of the second active fin 112. That is, the fourth trench 132T may expose the upper surface of the second active fin 112 without overlapping the vertical end portion of the second active fin 112. The bottom surface of the fourth trench 132T may be defined by the upper surface of the second active fin 112. The side wall of the fourth trench 132T may be defined by the interlayer insulating layer 105.

The second gate electrode 132 may fill the fourth trench 132T. The second gate electrode 132 may be formed on the second active fin 112 to be spaced apart from the second dummy gate electrode 122. Further, the second gate electrode 132 may include a second filling metal layer 150', a fourth metal oxide layer 162', a gate insulating layer, and a second metal gate 172'.

The fourth metal oxide layer 162' may be, e.g., substantially the same as the third metal oxide layer 161'. The fourth metal oxide layer 162' may extend along the side wall and the bottom surface of the fourth trench 132T. The second metal gate 172' may be, e.g., substantially the same as the first metal gate 171'.

Referring to FIGS. 1 and 3, the width W22 of the second lower portion 122TL of the second trench 122T may be larger than the width W12 of the first lower portion 121TL of the first trench 121T. The relative widths of W22 and W12 may affect the relative widths W11 and W21.

In detail, in the semiconductor device according to embodiments, the degree of overlap between the active fin and the dummy gate electrode in the first region and the second region of the substrate 100, i.e., respective widths W11 and W21, may be adjusted. For example, by making W21 smaller than W11 (i.e., making W22 larger than W12), the first metal oxide layer 161 may, e.g., completely, fill the first lower portion 121TL of the first trench 121T, and the second metal oxide layer 162 may not fill the first lower portion 122TL of the second trench 122T, e.g., the second metal oxide layer 162 may only partially fill the first lower portion 122TL of the second trench 122T by conformally extending along inner surfaces of the second trench 122T (e.g., FIGS. 10*b*-10*c*). In this case, for example, W1 and W2 may be equal to each other. However, the present disclosure is not limited thereto. For example, even if W1 is different from W2, W22 may be larger than W12.

The first metal oxide layer 161 and the second metal oxide layer 162 may apply stress to the channel region that is formed in each active fin 111 and 112, respectively. For example, when the first and second active fins 111 and 112 are on the same substrate (e.g., combined FIG. 4 and FIG. 14), the first metal oxide layer 161 may fill the first lower portion 121TL of the first trench 121T to apply a compression stress to the channel region in the first active fin 111. For example, the second metal oxide layer 162 may be conformally formed without filling the second lower portion 122TL of the second trench 122T to reduce the compression stress that is applied to the channel region in the second active fin 112.

In the semiconductor device according to embodiments, the performance of the semiconductor device can be improved through adjustment of the stress that is applied to the channel region of the transistor using the dummy gate.

Hereinafter, referring to FIGS. 1 and 11 to 14, a semiconductor device according to some embodiments will be described. For clarity, duplicate explanation of the contents as described above will be omitted, and explanation will be made regarding the different points between the embodiments.

Figure 11:
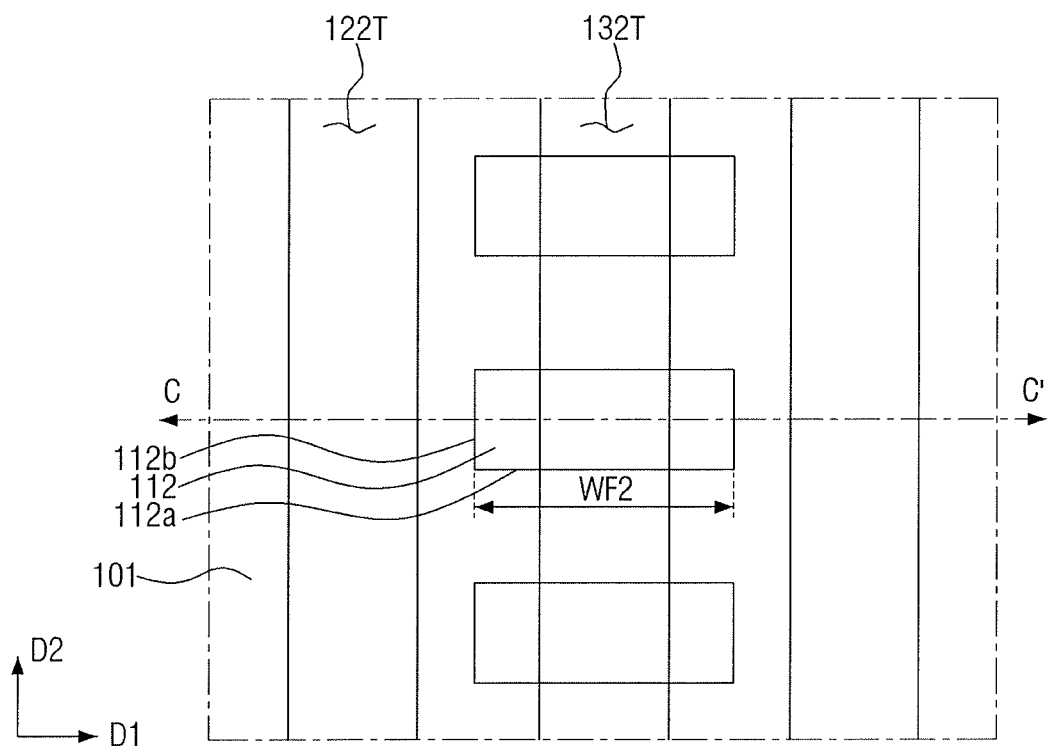
FIG. 11 illustrates a layout diagram of a semiconductor device according to some embodiments.
Figure 12:
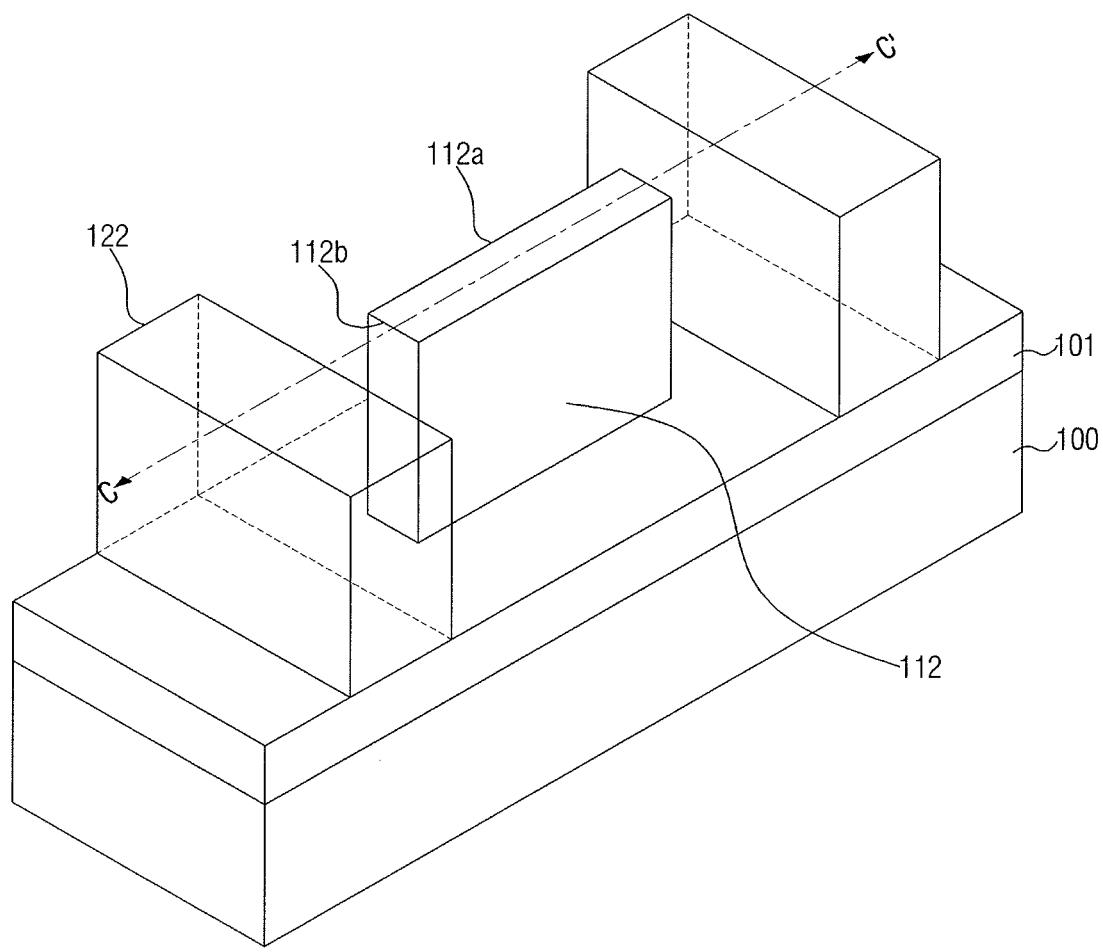
FIG. 12 illustrates a perspective view of FIG. 11.
Figure 13:
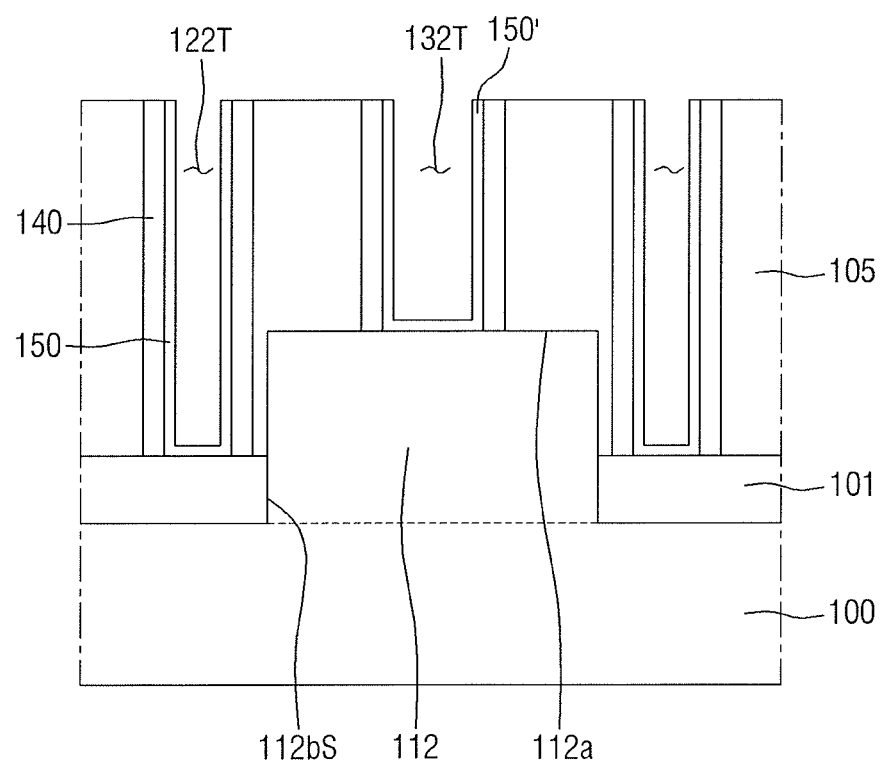
FIGS. 13 and 14 illustrate cross-sectional views taken along line C-C' of FIG. 11.
Figure 14:
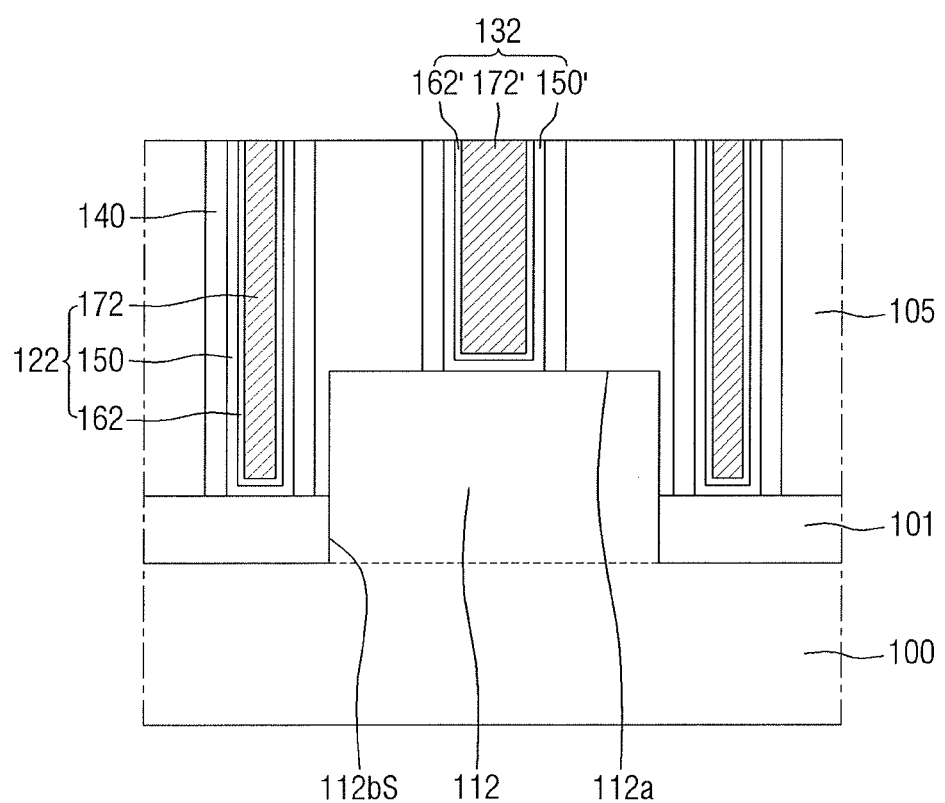

FIG. 11 is a layout diagram of a semiconductor device according to some embodiments. For convenience in explanation, illustration of the interlayer insulating layer 105, the spacer 140, and the first filling metal layer 150 is omitted in the drawing. FIG. 12 is a perspective view of FIG. 11. For convenience in explanation, illustration of the interlayer insulating layer 105, a second gate electrode 132, the spacer 140, a dummy gate insulating layer, the second metal oxide layer 162, and the first filling metal layer 150 is omitted, and only the shape of a second dummy gate electrode 122 is illustrated. FIGS. 13 and 14 are cross-sectional views taken along line C-C' of FIG. 11.

Referring to FIGS. 11 to 14, the second trench 122T that does not expose a vertical end portion of a second active fin 112 may be formed.

A semiconductor device according to some embodiments as illustrated in FIGS. 1 to 14 may be formed in the second region of the substrate 100. In some embodiments, the second region of the substrate 100 may be, e.g., a region in which an NMOS is formed.

Figure 10C:
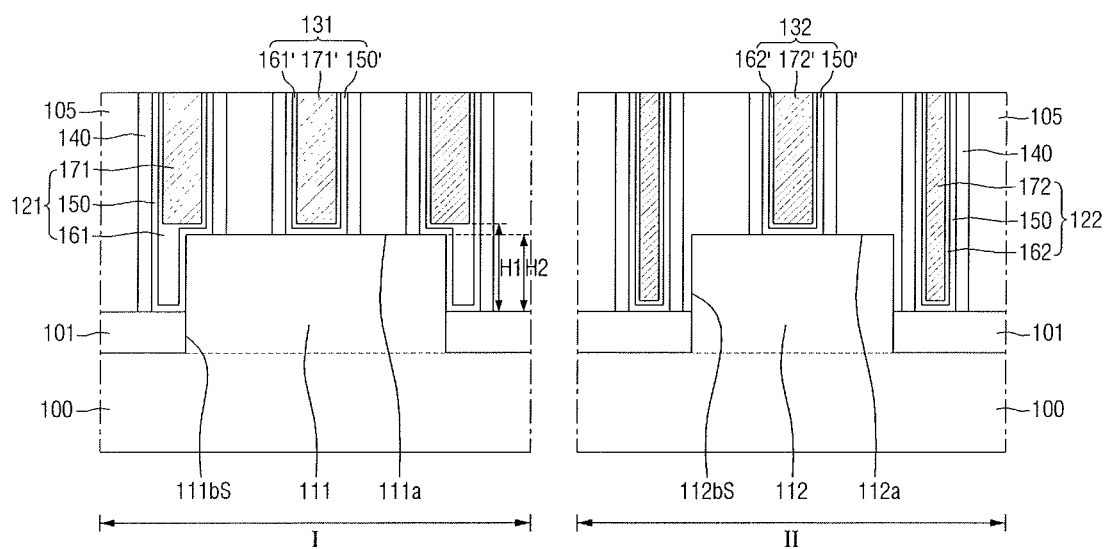

In detail, the second trench 122T may be formed in an insulating layer. Here, the insulating layer may include the interlayer insulating layer 105 and a field insulating layer 101. The side wall and the bottom surface of the second trench 122T may be defined by the insulating layer. In detail, the bottom surface of the second trench 122T may be defined by the field insulating layer 101. That is, the second trench 122T may expose the upper surface of the field insulating layer 101. The second trench 122T may not expose the short side 112b of the second active fin 112. The width of the second trench 122T may be W2, e.g., the entire second trench 122T may have a uniform width W2 with the second dummy metal gate 172 extending along its entire depth to the field insulating layer 101 (FIGS. 10c and 14).

In the drawing, it is illustrated that the side wall 112bs that includes the short side 112b of the second active fin 112 does not come in contact with a part of the side wall of the second trench 122T. However, this is merely for convenience in explanation, and the present disclosure is not limited thereto. For example, the side wall 112bs that includes the short side 112b of the second active fin 112 and a part of the side wall of the second trench 122T may be formed to come in contact with each other. In this case, at least a part of the side wall of the second trench 122T may be defined by the side wall 112bs that includes the short side 112b of the second active fin 112.

Referring to FIG. 1, the length WF1 in the first direction D1 of the first active fin 111 may be different from the length WF2 in the first direction D1 of the second active fin 112 in FIG. 11. In some embodiments, the length WF1 in the first direction D1 may be longer than the length WF2 in the first direction D1 of the second active fin 112. In some embodiments, by making the length of the first active fin 111 of the first region differ from the length of the second active fin 112 of the second region, it may possible to adjust the stress that is applied to the channel region of the transistor.

Hereinafter, referring to FIGS. 15 to 18, a semiconductor device according to some embodiments will be described. For clarity, duplicate explanation of the contents as described above will be omitted, and explanation will be made regarding the different points between the embodiments.

Figure 15:
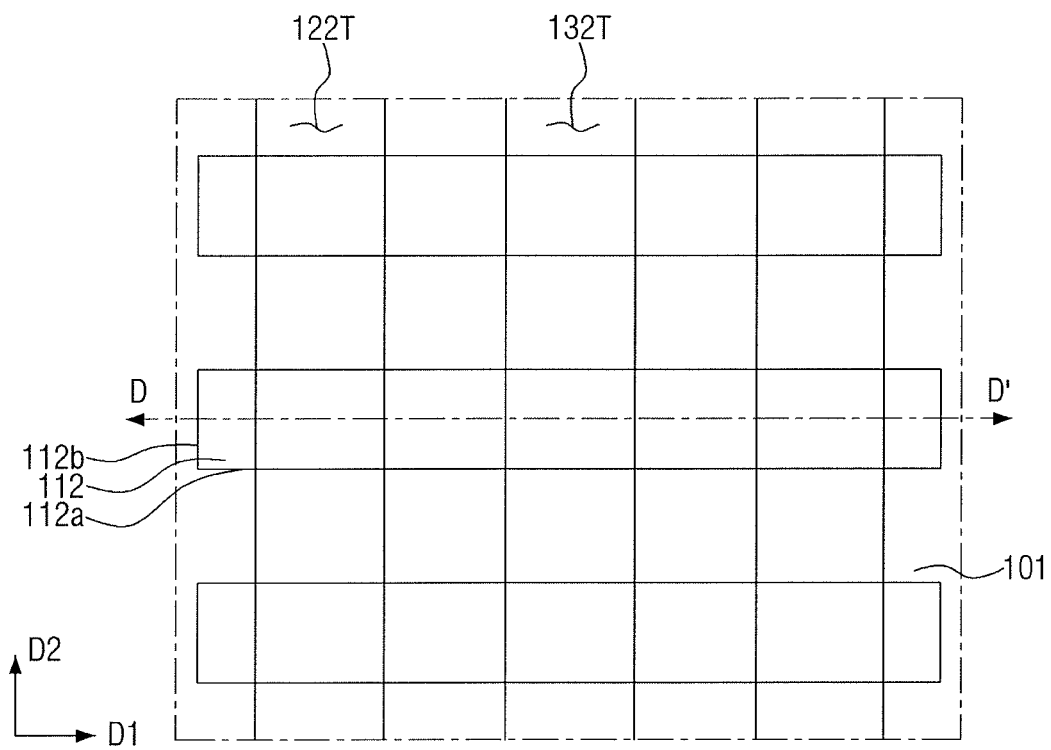
FIG. 15 illustrates a layout diagram of a semiconductor device according to some embodiments.
Figure 16:
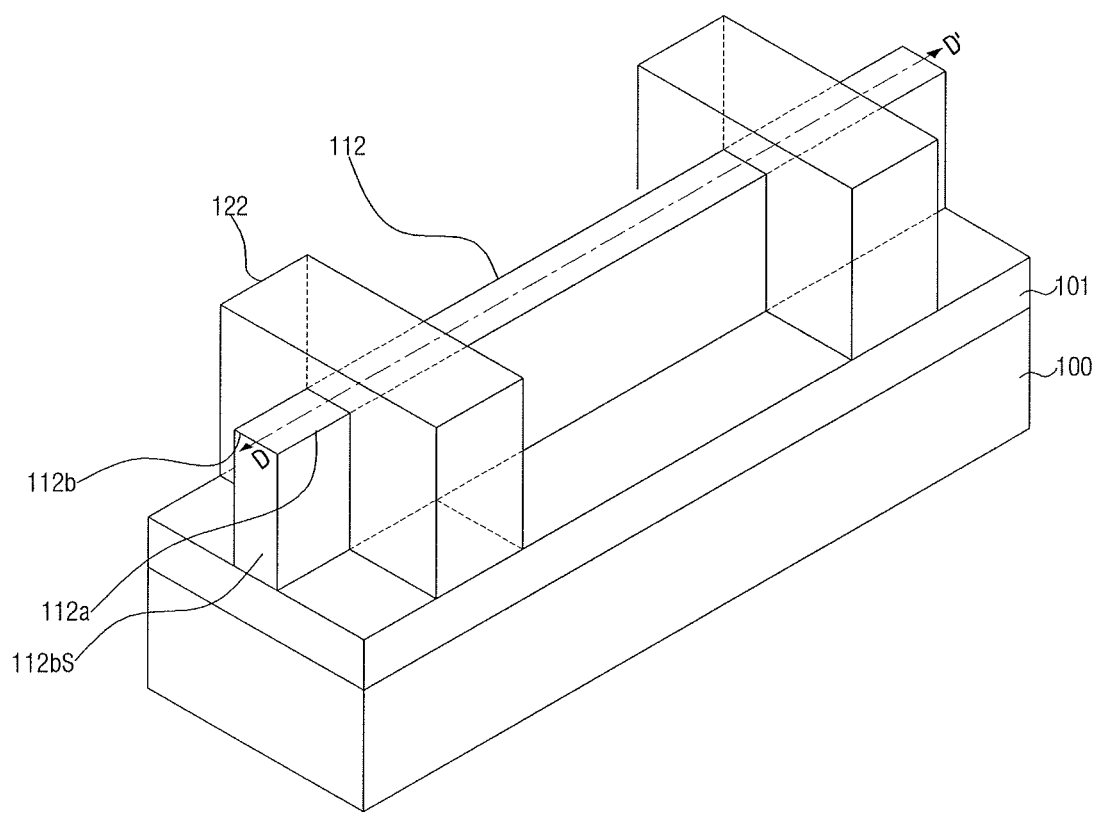
FIG. 16 illustrates a perspective view of FIG. 15.
Figure 17:
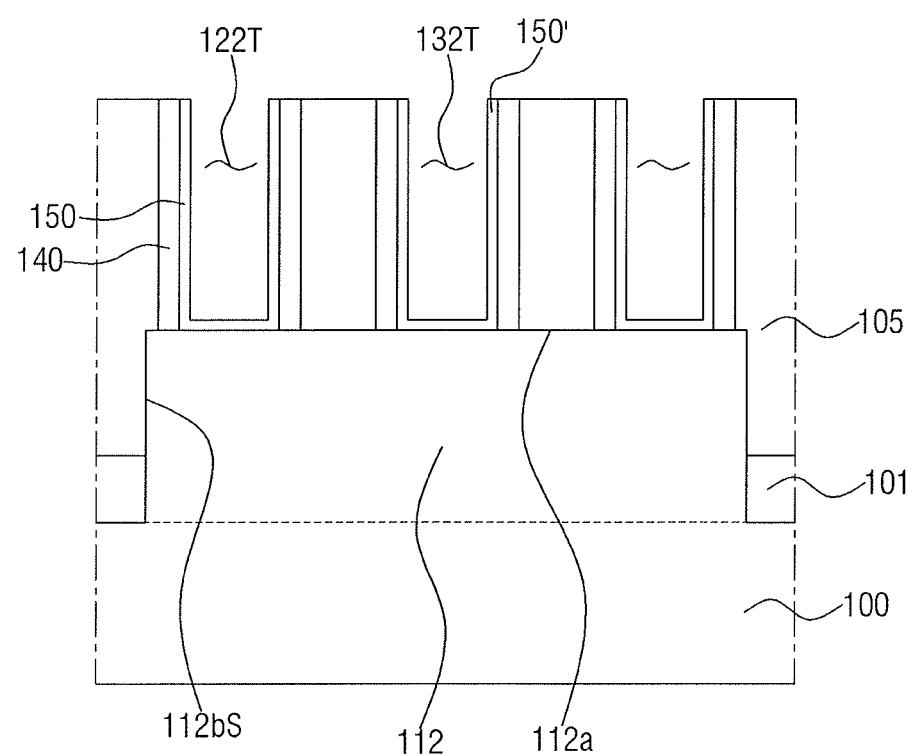
FIGS. 17 and 18 illustrate cross-sectional views along line D-D' of FIG. 15.
Figure 18:
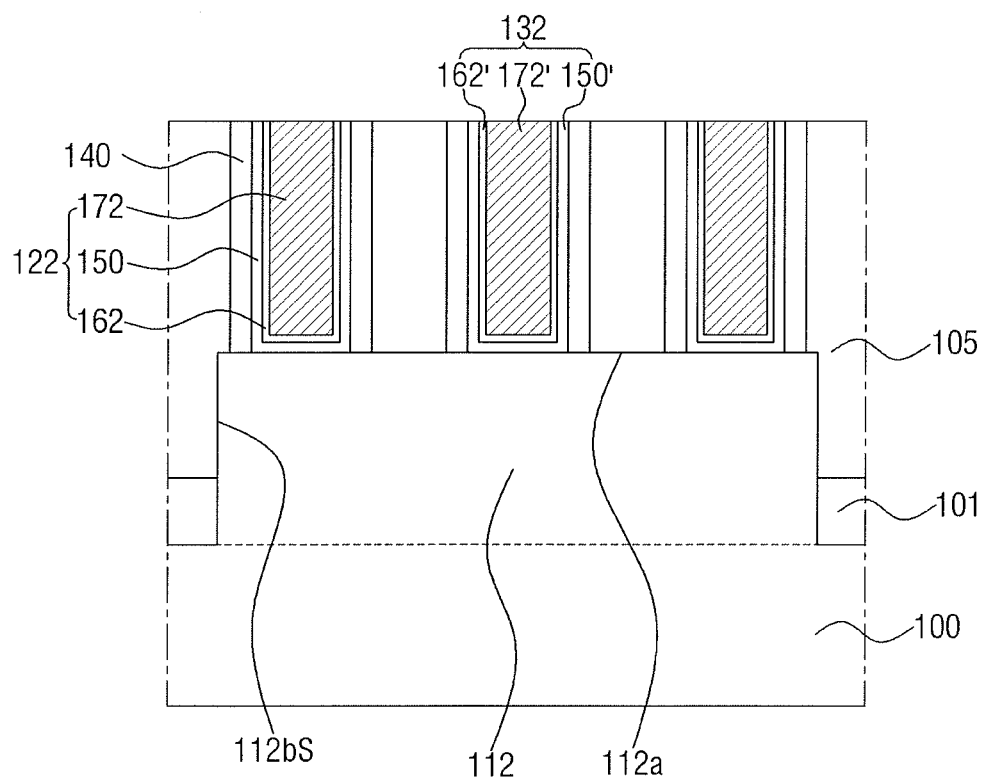

FIG. 15 is a layout diagram of a semiconductor device according to some embodiments. For convenience in explanation, illustration of the interlayer insulating layer 105, the spacer 140, and the first filling metal layer 150 is omitted in FIG. 15. FIG. 16 is a perspective view of FIG. 15. For convenience in explanation, illustration of the interlayer insulating layer 105, the second gate electrode 132, the spacer 140, the dummy gate insulating layer, the second metal oxide layer 162, and the first filling metal layer 150 is omitted in FIG. 16, and only the shape of a second dummy gate electrode 122 is illustrated. FIGS. 17 and 18 are cross-sectional views taken along line D-D' of FIG. 15.

Referring to FIGS. 15 to 18, a second trench 122T that does not overlap a vertical end portion of a second active fin 112 may be formed.

A semiconductor device according to some embodiments as illustrated in FIGS. 15 to 18 may be formed in the second region of the substrate 100. In some embodiments, the second region of the substrate 100 may be, e.g., a region in which an NMOS is formed.

The second trench 122T may be formed within the interlayer insulating layer 105. The side wall of the second trench 122T may be defined by the interlayer insulating layer 105. The bottom surface of the second trench 122T may be defined by the upper surface of the second active fin 112. That is, the second trench 122T may expose a part of the upper surface of the second active fin 112 and may not expose the short side 112b of the second active fin 112. In some embodiments, both the bottom surface of the second trench 122T and the bottom surface of a fourth trench 132T may be defined by the upper surface of the second active fin 112.

Hereinafter, referring to FIGS. 19 and 20, a semiconductor device according to some embodiments will be described. For clarity, the duplicate explanation of the contents as described above will be omitted, and explanation will be made around the different points between the embodiments.

Figure 19:
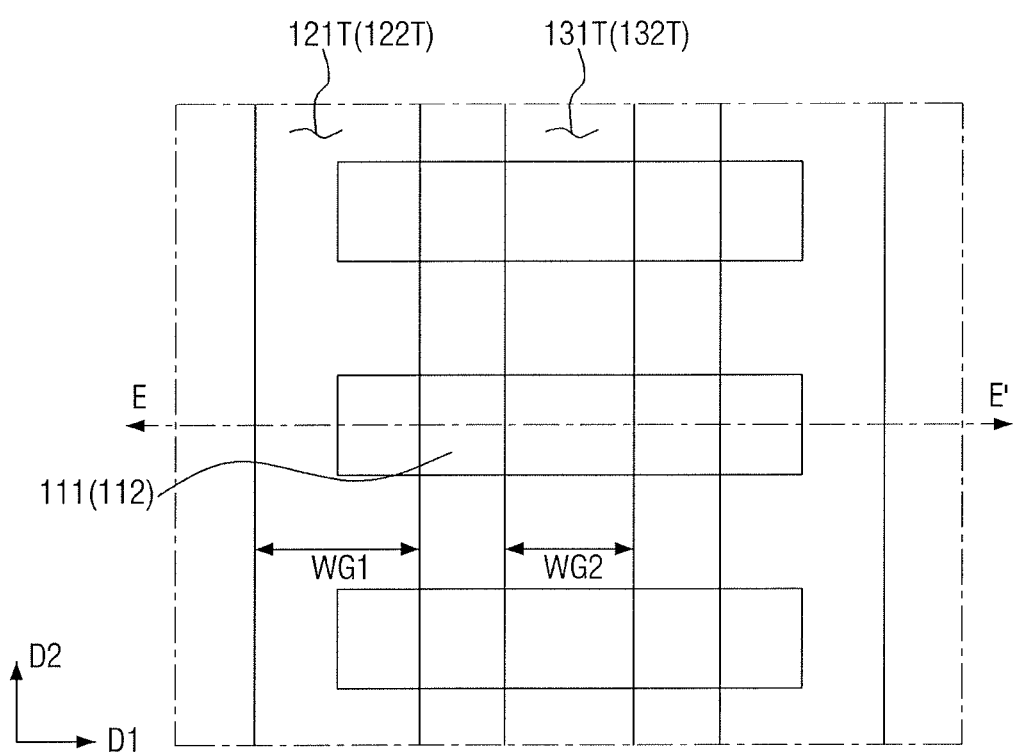
FIG. 19 illustrates a layout diagram of a semiconductor device according to some embodiments.

FIG. 19 is a layout diagram of a semiconductor device according to some embodiments. For convenience in explanation, illustration of the interlayer insulating layer 105, the spacer 140, and the first filling metal layer 150 is omitted in the drawing. FIG. 20 is a cross-sectional view taken along line E-E' of FIG. 19.

Figure 20:
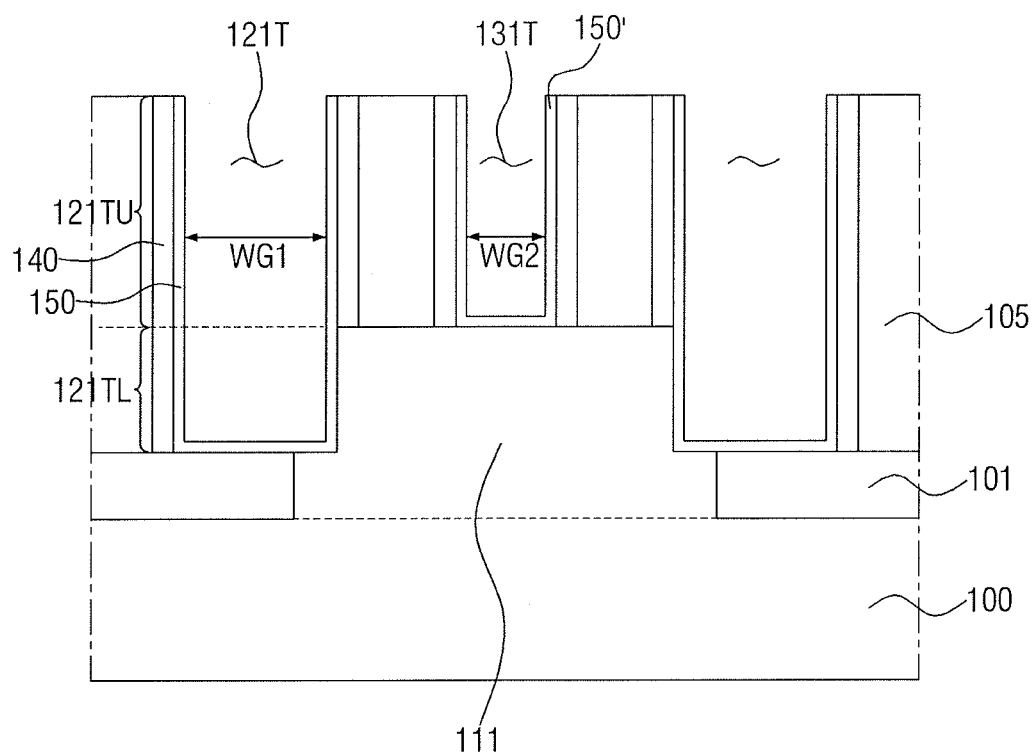
FIG. 20 illustrates a cross-sectional view taken along line E-E' of FIG. 19.

A semiconductor device according to some embodiments as illustrated in FIG. 20 may be formed in the first region of the substrate 100. In some embodiments, the first region of the substrate 100 may be, e.g., a region in which a PMOS is formed.

The first trench 121T may be formed in the insulating layer. Here, the insulating layer may include the interlayer insulating layer 105 and the field insulating layer 101.

A part of the bottom surface of the first lower portion 121TL of the first trench 121T may be defined by the first active fin 111. At least a part of the side wall of the first lower portion 121TL of the first trench 121T may be defined by the side wall 111bs that includes the short side 111b of the first active fin 111.

In the drawing, it is illustrated that the width of the first upper portion 121TU of the first trench 121T is equal to the width of the first lower portion 121TL of the first trench 121T. However, the present disclosure is not limited thereto. For example, the width of the first upper portion 121TU of the first trench 121T may be different from the width of the first lower portion 121TL of the first trench 121T.

In detail, at least a part of the first lower portion 121TL of the first trench 121T may be formed within the first active fin 111. In this case, the length in the first direction D1 on the uppermost surface of the first active fin 111 may be different from the length in the first direction D1 on the boundary between the first active fin 111 and the bottom surface of the first trench 121T.

The third trench 131T may be formed to be spaced apart from the first trench 121T in the interlayer insulating layer 105. In some embodiments, the width WG1 of the first upper portion 121TU of the first trench 121T may be different from the width WG2 of the third trench 131T.

For example, the width WG1 of the first upper portion 121TU of the first trench 121T may be larger than the width WG2 of the third trench 131T. Here, the width WG1 of the first upper portion 121TU of the first trench 121T may be, e.g., the widest width of the first upper portion 121TU of the first trench 121T. Further, the width WG2 of the third trench 131T may be, e.g., the widest width of the third trench 131T. However, the present disclosure is not limited thereto. The width of the first upper portion 121TU of the first trench 121T and the width WG2 of the third trench 131T may be an average value of the width of the first upper portion 121TU of the first trench 121T or an average value of the width of the third trench 131T.

The first dummy gate electrode 121 may be formed in the first trench 121T. The first gate electrode 131 may be formed in the third trench 131T. In this case, the width of the first dummy gate electrode 121 may be wider than the width of the first gate electrode 131.

Hereinafter, referring to FIGS. 19 to 21, a semiconductor device according to some embodiments will be described. For clarity, duplicate explanation of the contents as described above will be omitted, and explanation will be made regarding the different points between the embodiments.

Figure 21:
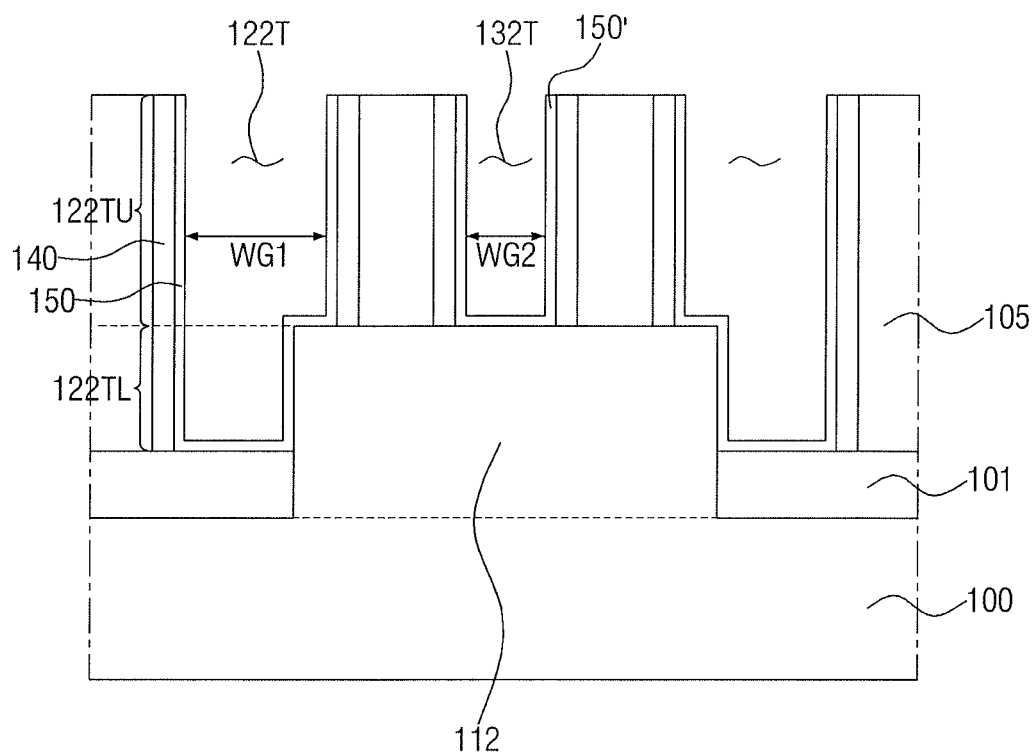
FIG. 21 illustrates a cross-sectional view taken along line E-E' of FIG. 19.

FIG. 21 is a cross-sectional view taken along line E-E' of FIG. 19.

A semiconductor device according to some embodiments as illustrated in FIG. 21 may be formed in the second region of the substrate 100. In some embodiments, the second region of the substrate 100 may be, e.g., a region in which an NMOS is formed.

The second trench 122T may include a second upper portion 122TU and a second lower portion 122TL on the basis of the upper surface of the second active fin 112. The second trench 122T may overlap the vertical end portion of the second active fin 112. At least a part of the side wall of the first upper portion 122TU of the second trench 122T may be defined by the interlayer insulating layer 105.

The fourth trench 132T may be formed to be spaced apart from the second trench 122T in the interlayer insulating layer 105. In some embodiments, the width WG1 of the second upper portion 122TU of the second trench 122T may be different from the width WG2 of the fourth trench 132T.

For example, the width WG1 of the second upper portion 122TU of the second trench 122T may be larger than the width WG2 of the fourth trench 132T.

Figure 22:
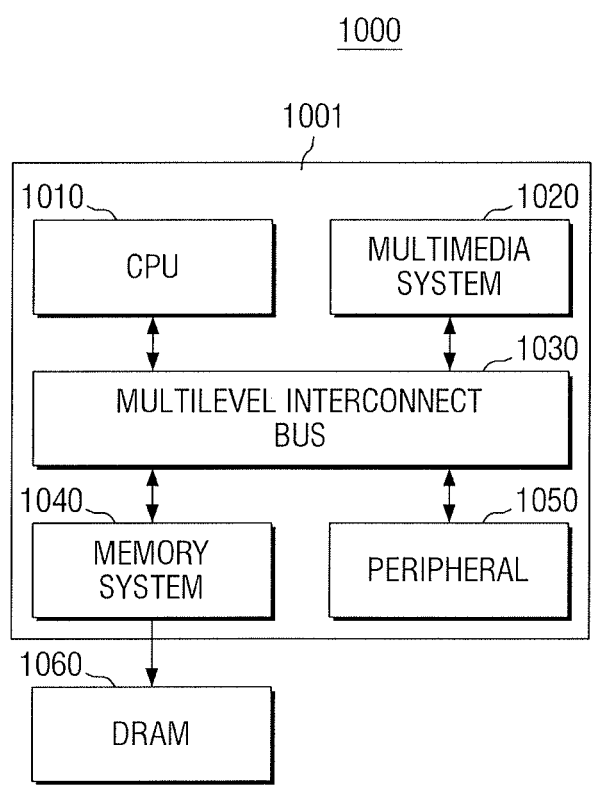
FIG. 22 illustrates a block diagram of a SoC with a semiconductor device according to some embodiments.

FIG. 22 is a block diagram of a system on chip (SoC) that includes a semiconductor device according to embodiments.

Referring to FIG. 22, a SoC 1000 includes an application processor 1001 and a DRAM 1060.

The application processor 1001 may include a central processing unit 1010, a multimedia system 1020, a bus 1030, a memory system 1040, and a peripheral circuit 1050.

The central processing unit 1010 may perform operations required to drive the SoC 1000. In some embodiments, the central processing unit 1010 may be configured in a multi-core environment including a plurality of cores.

The multimedia system 102 may be used when the SoC 100 performs various kinds of multimedia functions. The multimedia system 1020 may include a 3D engine module, a video codec, a display system, a camera system, and a post-processor.

The bus 1030 may be used when the central processing unit 1010, the multimedia system 1020, the memory system 1040, and the peripheral circuit 1050 perform data communication with each other. In some embodiments, examples of the bus 1030 may include a multilayer AHB (Advanced High-performance Bus) and a multilayer AXI (Advanced eXtensible Interface), but is not limited thereto.

The memory system 1040 may provide an environment that is necessary when the application processor 1001 is connected to an external memory (e.g., DRAM 1060) to perform high-speed operation. In some embodiments, the memory system 1040 may include a separate controller (e.g., DRAM controller) for controlling the external memory (e.g., DRAM 1060).

The peripheral circuit 1050 may provide an environment that is necessary when the SoC 1000 is smoothly connected to the external device (e.g., main board). Accordingly, the peripheral circuit 1050 may be provided with various interfaces for making the external device connected to the SoC 1000 compatible.

The DRAM 1060 may function as an operating memory that is necessary when the application processor 1001 operates. In some embodiments, the DRAM 1060 may be arranged on an outside of the application processor 1001 as illustrated in the drawing. Specifically, the DRAM 1060 and the application processor 1001 may be packaged in the form of PoP (Package on Package).

At least one of the constituent elements of the SoC 1000 may adopt any one of the semiconductor devices fabricated according to the embodiments.

By way of summation and review, according to embodiments, a dummy gate is used to apply stress to the channel of the transistor. In detail, a width of the dummy gate of a NMOS region is different from a width of the dummy gate of a PMOS region, so that the filling of the respective dummy gates, e.g., TiN filling, may be different. For example, in the NMOS region, a lower portion of the dummy gate may not be filled with TiN, while in the PMOS transistor, a lower portion of the dummy gate may be filled with TiN. Also, in the dummy gate of NMOS and PMOS transistors, a width of the upper portion of the dummy gate is different from a width of the lower portion of the dummy gate.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
   a substrate including a first region and a second region;
   a first active fin projecting from the first region of the substrate;
   a second active fin projecting from the second region of the substrate;
   an interlayer insulating layer covering the first active fin and the second active fin on the substrate;
   a first trench overlapping a vertical end portion of the first active fin in the interlayer insulating layer and including a first upper portion and a first lower portion, wherein the first upper portion of the first trench and the first lower portion of the first trench discriminate against each other on the basis of an upper surface of the first active fin;
   a second trench overlapping a vertical end portion of the second active fin in the interlayer insulating layer and including a second upper portion and a second lower portion, wherein the second upper portion of the second trench and the second lower portion of the second trench discriminate against each other on the basis of an upper surface of the second active fin;
   a first dummy gate electrode filling the first trench and including a first metal oxide layer and a first filling metal layer, wherein the first metal oxide layer fills the first lower portion of the first trench and is formed along a side wall of the first upper portion of the first trench; and
   a second dummy gate electrode filling the second trench and including a second metal oxide layer and a second filling metal layer, wherein the second metal oxide layer extends along a side wall and a bottom surface of the second trench.

2. The semiconductor device as claimed in claim 1, wherein each of the first metal oxide layer and the second metal oxide layer includes titanium oxide.

3. The semiconductor device as claimed in claim 1, wherein at least a part of a side wall of the first lower portion of the first trench is defined by a side wall that includes a short side of the first active fin.

4. The semiconductor device as claimed in claim 1, wherein a width of the first upper portion of the first trench is larger than a width of the first lower portion of the first trench.

5. The semiconductor device as claimed in claim 1, wherein a width of the first upper portion of the first trench is equal to a width of the first lower portion of the first trench.

6. The semiconductor device as claimed in claim 1, wherein at least a part of a side wall of the second lower portion of the second trench is defined by a side wall that includes a short side of the second active fin.

7. The semiconductor device as claimed in claim 1, wherein a width of the second lower portion of the second trench is larger than a width of the first lower portion of the first trench.

8. The semiconductor device as claimed in claim 1, wherein a width of the second upper portion of the second trench is larger than a width of the second lower portion of the second trench.

9. The semiconductor device as claimed in claim 1, wherein the first region is a PMOS region, and the second region is an NMOS region.

10. A semiconductor device, comprising:
    a substrate including a first region and a second region;
    a first active fin projecting from the first region of the substrate;
    a second active fin projecting from the second region of the substrate;
    an interlayer insulating layer covering the first active fin and the second active fin on the substrate;
    a first trench overlapping a vertical end portion of the first active fin in the interlayer insulating layer and including a first upper portion and a first lower portion, wherein the first upper portion of the first trench and the first lower portion of the first trench discriminate against each other on the basis of an upper surface of the first active fin;
    a second trench non-overlapping a vertical end portion of the second active fin in the interlayer insulating layer;
    a first dummy gate electrode filling the first trench and including a first metal oxide layer and a first filling metal layer, wherein the first metal oxide layer fills the first lower portion of the first trench and is formed along a side wall of the first upper portion of the first trench; and
    a second dummy gate electrode filling the second trench and including a second metal oxide layer and a second filling metal layer, wherein the second metal oxide layer extends along a side wall and a bottom surface of the second trench.

11. The semiconductor device as claimed in claim 10, wherein each of the first metal oxide layer and the second metal oxide layer includes titanium oxide.

12. The semiconductor device as claimed in claim 10, wherein at least a part of a side wall of the first lower portion of the first trench is defined by a side wall that includes a short side of the first active fin.

13. The semiconductor device as claimed in claim 10, wherein a width of the first upper portion of the first trench is larger than a width of the first lower portion of the first trench.

14. The semiconductor device as claimed in claim 10, wherein a width of the first upper portion of the first trench is equal to a width of the first lower portion of the first trench.

15. The semiconductor device as claimed in claim 10, wherein the second trench exposes a part of an upper surface of the second active fin.

16. A semiconductor device, comprising:
    a substrate including a first region and a second region;
    a first active fin projecting from the first region of the substrate;
    a second active fin projecting from the second region of the substrate;

an interlayer insulating layer covering the first active fin and the second active fin on the substrate;

a first trench overlapping a vertical end portion of the first active fin in the interlayer insulating layer and including a first upper portion and a first lower portion, the first upper and lower portions being separated from each other at an upper surface of the first active fin;

a second trench overlapping a vertical end portion of the second active fin in the interlayer insulating layer and including a second upper portion and a second lower portion, the second upper and lower portions of the second trench being separated from each other at an upper surface of the second active fin;

a first dummy gate electrode filling the first trench and including a first metal oxide layer and a first filling metal layer, the first metal oxide layer completely filling the first lower portion of the first trench and being conformal along a side wall of the first upper portion of the first trench; and a second dummy gate electrode filling the second trench and including a second metal oxide layer and a second filling metal layer, the second metal oxide layer being conformal along side walls of each of the second upper and lower portions of the second trench.

17. The semiconductor device as claimed in claim 16, wherein the first filling metal layer is only in the first upper portion of the first trench.

18. The semiconductor device as claimed in claim 17, wherein the second metal oxide layer defines a space in the second lower portion of the second trench, at least a portion of second filling metal layer is in the space defined in the second lower portion of the second trench.

19. The semiconductor device as claimed in claim 16, wherein a width of the second lower portion of the second trench is larger than a width of the first lower portion of the first trench.

20. The semiconductor device as claimed in claim 16, wherein at least a portion of each of the first and second upper portions of the first and second trenches, respectively, is above an upper surface of a the first and second active fins, respectively.

* * * * *